United States Patent [19]
Munday

[11] Patent Number: 5,133,013
[45] Date of Patent: Jul. 21, 1992

[54] NOISE REDUCTION BY USING SPECTRAL DECOMPOSITION AND NON-LINEAR TRANSFORMATION

[75] Inventor: Edward Munday, Ipswich, England

[73] Assignee: British Telecommunications public limited company, London, England

[21] Appl. No.: 401,455
[22] PCT Filed: Jan. 18, 1989
[86] PCT No.: PCT/GB89/00049
§ 371 Date: Sep. 15, 1989
§ 102(e) Date: Sep. 15, 1989
[87] PCT Pub. No.: WO89/06877
PCT Pub. Date: Jul. 27, 1989

[30] Foreign Application Priority Data

Jan. 18, 1988 [GB] United Kingdom ............... 8801014

[51] Int. Cl.$^5$ ................................................ G10L 7/08
[52] U.S. Cl. ................................................ 381/47
[58] Field of Search ............................ 381/41–47, 381/71, 73.1, 94

[56] References Cited

U.S. PATENT DOCUMENTS

| | | | |
|---|---|---|---|
| 3,989,897 | 11/1976 | Carver | 381/94 |
| 4,221,934 | 9/1980 | Schiff | 370/7 |
| 4,544,916 | 10/1985 | Sharper | 340/347 |
| 4,630,304 | 12/1986 | Borth et al. | 381/47 |
| 4,658,426 | 4/1987 | Chabries et al. | 381/47 |
| 4,829,578 | 5/1989 | Roberts | 381/46 |
| 4,887,299 | 12/1989 | Cummins et al. | 381/71 |
| 4,897,878 | 1/1990 | Boll et al. | 381/47 |

FOREIGN PATENT DOCUMENTS

3029441A1 3/1982 Fed. Rep. of Germany.

OTHER PUBLICATIONS

"Speech Enhancement Using a Soft-Decision Noise Suppression Filter" by McAulay et al.; *IEEE Transactions on Acoustics, Speech and Signal Processing,* vol. ASSP-28, No. 2, Apr. 1980, p. 137.
"Suppression of Acoustic Noise in Speech Using Spectral Subtraction" by Boll; *IEEE Transactions on Acoustics, Speech and Signal Processing;* vol. ASSP-27, No. 2, Apr. 1979, p. 113.
"Enhancement of Speech Corrupted by Acoustic Noise" by Berouti et al.; Proceedings ICASSP, Apr. 1979, pp. 208–211.
"A Frequency Domain Noise Cancelling Preprocessor for Narrowband Speech Communications Systems" by Preuss; *1979-Proceedings ICASSP,* pp. 212–215.
"An Investigation of Several Frequency Domain Processing Methods for Enhancing the Intelligibility of Speech in Wideband Random Noise" by Curtis & Niederjohn; Proceedings ICASSP, Apr. 1978, pp. 602–605.
"A Non-Linear Spectrum Processing Technique for Speech Enhancement" by Eger et al.; Proceedings ICASSP 1983, pp. 18.a.a–18.a.1.4.

Primary Examiner—Emanuel S. Kemeny
Assistant Examiner—Michelle Doerrler
Attorney, Agent, or Firm—Nixon & Vanderhye

[57] ABSTRACT

A noise reduction system for enhancing noisy speech signals by performing a spectral decomposition on the signal, passing each spectral component through a non-linear stage which progressively attenuates lower intensity spectral components (uncorrelated noise) but passes higher intensity spectral components (correlated speech) relatively unattenuated, and reconstituting the signal. Frames of noisy signal are transformed into the frequency domain by an FFT (Fast-Fourier Transform) device, with windowing. Each transformed frame is then processed to effect a non-linear transfer characteristic, which is linear above a soft "knee" region, and rolls off below, and transformed back to a reconstituted time-domain signal with reduced noise by an IFFT (Inverse Fast Fourier Transform) device (with overlapping). A level control matches the signal to the characteristic. In further embodiments, the characteristic may vary between frequency bands, and may be matched to speech formants by tracking formants using an LSP (Linear Spectral Pairs) technique.

11 Claims, 7 Drawing Sheets

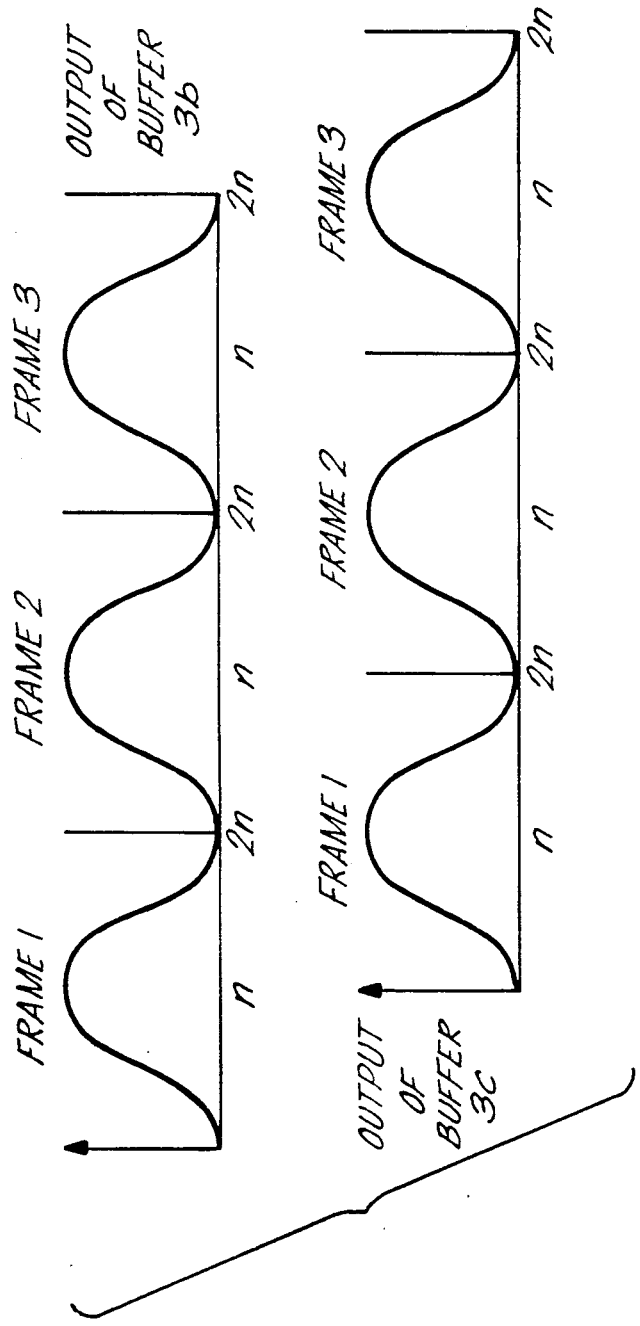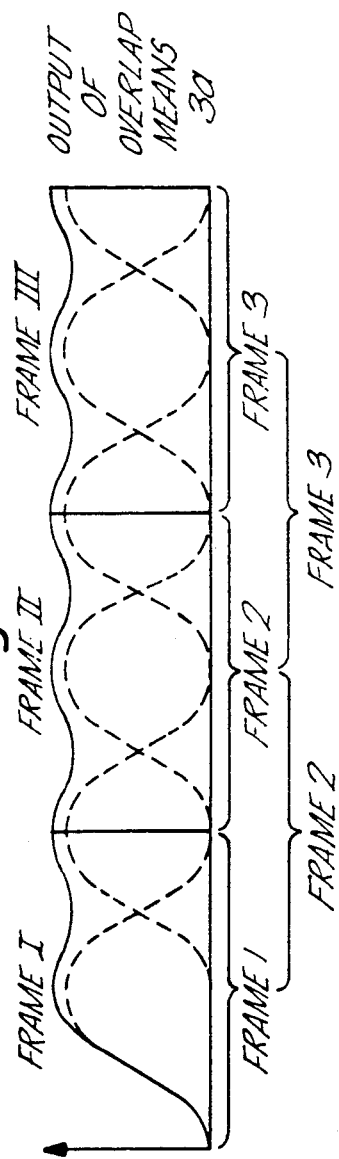

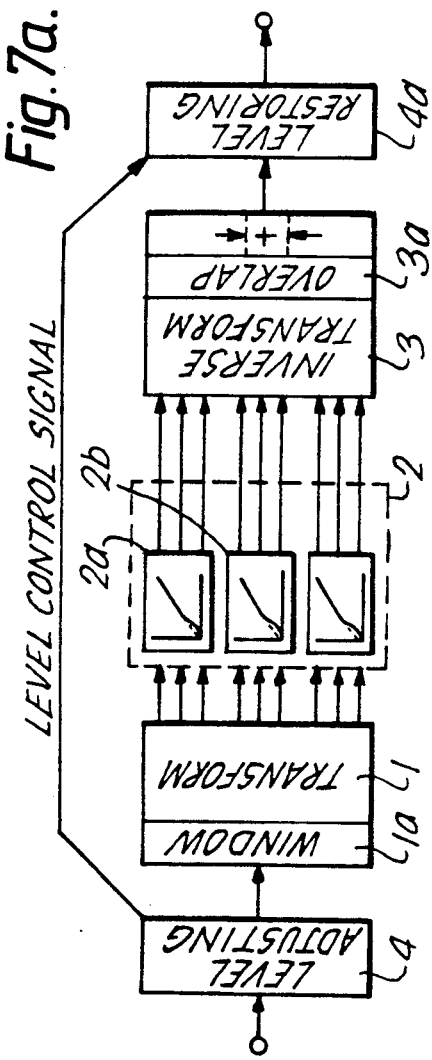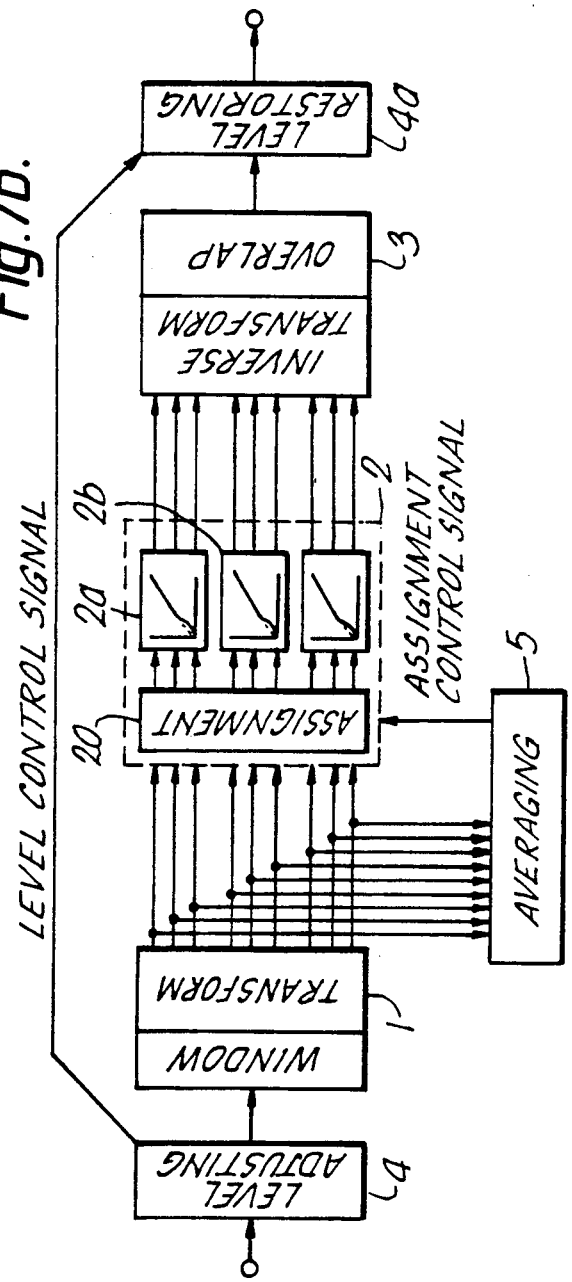

NOISE REDUCTION BY USING SPECTRAL DECOMPOSITION AND NON-LINEAR TRANSFORMATION

This invention relates to a method of reducing the level of noise in a signal, and to apparatus for reducing noise using this method; particularly but not exclusively this invention relates to a method of reducing noise in a speech signal, and to apparatus for thus producing a speech signal with enhanced intelligibility.

A signal will often acquire broadband noise so that the time-average noise power is spread across a portion of the noise spectrum. In a speech system, noise may cause a listener severe fatigue or discomfort.

It is obviously desirable to reduce noise, and many methods of doing so are known; in speech systems, some types of noise are more perceptually acceptable than others. Especially desirable are methods which may be used with existing transmission equipment, and preferably are easily added at the receiver end.

It is known to reduce noise in high noise environments (−6 to +6 dB signal-to-noise ratio) by so-called spectral subtraction techniques, in which the signal is processed by transforming it into the frequency domain, then subtracting an estimate of the noise power in each spectral band, then re-transforming into the time domain. This technique suffers from several drawbacks, however. Firstly, it is necessary to measure the noise power in each spectral line; this involves identifying 'non-speech' periods, which can be complicated and unreliable. Secondly, it requires the assumption that the noise spectrum is stationarry between the instants at which the noise power is measured; this is not necessarily the case. Thirdly, if an estimate of noise power made in one non-speech period is applied to the next non-speech period correctly, there will be a total absence of background noise during non-speech periods, and this modulation of the background noise sounds unpleasant to a listener.

According to the invention, there is provided a noise reduction apparatus comprising; first conversion means for receiving a time-varying signal and producing therefrom output signals representing the magnitude of spectral components thereof, processing means for receiving the output of the first conversion means, the processing means having a nonlinear transfer characteristic such that in use low magnitude inputs thereto are attenuated relative to high magnitude inputs, the transfer characteristic being linear for high magnitude spectral components, and second conversion means for receiving the output of the processing means and reconstituting therefrom a time-varying signal.

Preferably, the transition between the linear and nonlinear regions of the characteristic is gradual and substantially without discontinuities in slope, so as to progressively roll off lower magnitude (noise) spectral components.

Preferably, a level adjusting operation is performed so that the signal is maintained in a predetermined relation to the transfer characteristic, which may be an automatic gain control operation on the signal.

Preferably the first conversion operates on frames of the signal and uses a one dimensional or complex transform to produce a series of transform coefficients, and the second conversion applies the inverse transform to reconstitute the signal. In a preferred embodiment a Fast Fourier transform is utilized. Where such a transform is employed, it will be advantageous to provide shaping of each frame using a window function, so as to reduce frequency 'leakage' when the frame is transformed. Where such a window function is employed, the sampled data frames are preferably overlapped.

In a second embodiment, several different transfer characteristics are employed within the processing so that a more severe attenuation is effected in certain spectral regions. Where the signal is a speech signal, these regions may be assigned on a fixed basis, employing knowledge of the spectral position of speech formant bands for an average speaker, or may be derived by the apparatus for each speaker by initially measuring formant band time-averaged positions.

In a third embodiment, several different transfer characteristics are employed, and the spectral positions of the dominant bands of the signal continuously tracked so that a more severe attenuation may be effected in spectral regions where there are no significant components of the signal. This is advantageously achieved by using a Line Spectral Pair (LSP) technique with a filter of suitable order to track the formants of a speech signal.

A transmission channel may be positioned either before or after the processing means, so that the apparatus may comprise a transform coding transmission system. In these aspects, also provided are a transmitter including such processing means and, separately, a receiver including such processing means (in any such systtem, only one end needs the processing means).

According to another aspect of the invention there is provided a method of reducing noise in a time-varying signal comprising the steps of; converting the signal into a plurality of signals representing the magnitude of spectral components of the signal, processing each such signal so that low magnitude spectral components are attenuated relative to high magnitude spectral components, leaving the relationship between such high magnitude spectral components undistorted; and converting the signals thus processed so as to produce a reconstituted time-varying signal having an attenuated noise content.

BRIEF DESCRIPTION OF THE DRAWINGS

These embodiments of the invention will now be described by way of example with reference to the drawings, in which:

FIGS. 6a–b shows the effect of overlapping frames of data in accordance with one embodiment of the invention;

FIG. 7a shows schematically a second embodiment of the invention;

FIG. 7b shows schematically a further modification of this second embodiment.

DESCRIPTION OF DRAWINGS

Figure 1:
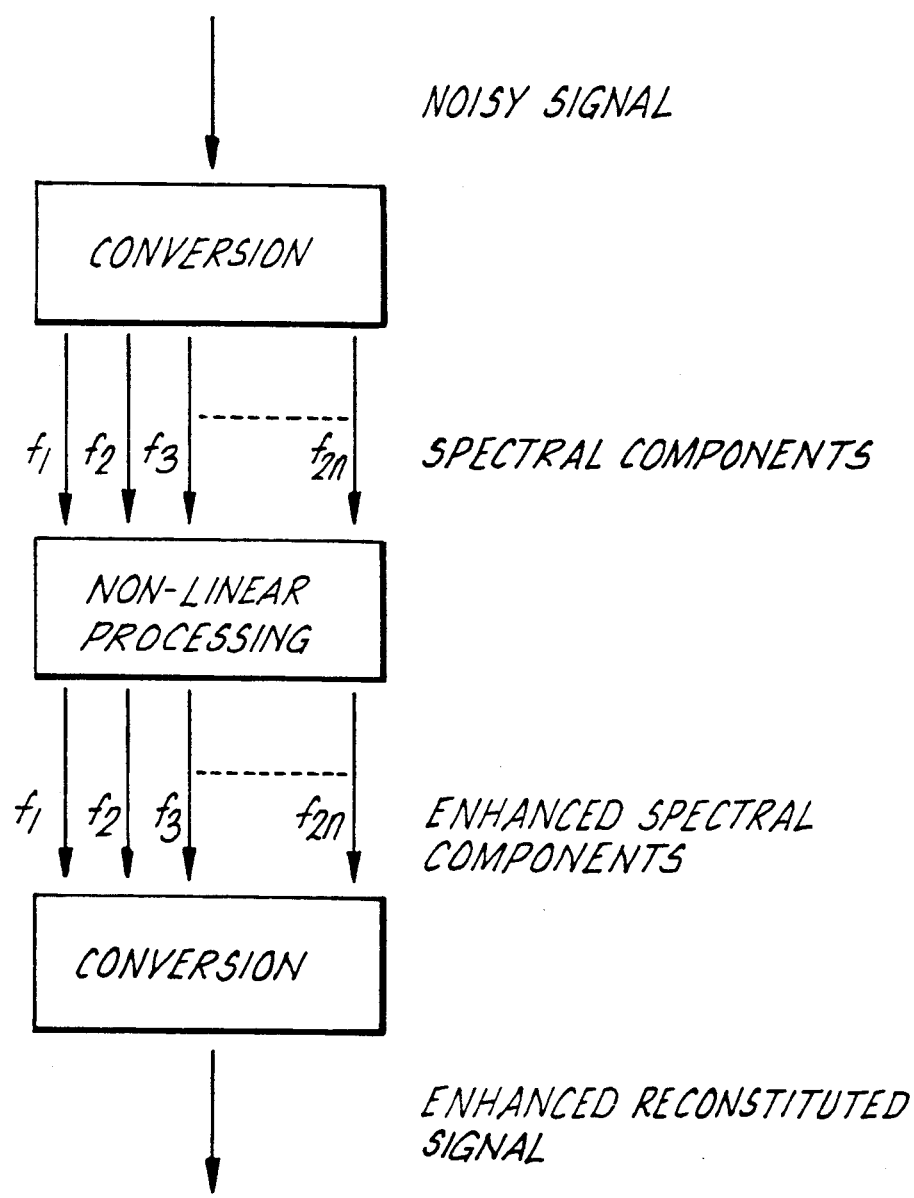
FIG. 1 shows schematically the method of the invention, and the operation of the apparatus of the invention.

Referring to FIG. 1, a signal which includes noise is received and resolved into a series of signals representing the magnitude of the various components present; this first conversion operation could for example simply comprise filtering the signal through a plurality of parallel band pass filters, but will preferably comprise performing a one dimensional or complex transform operation such as the Discrete Fourier transform (DFT) or the Discrete Cosine Transform (DCT) on frames of samples of the signal.

The transform operation may be performed by a suitably programmed general purpose computer, or by separate conversion means such as the one of the many dedicated Fast Fourier Transform chip package currently available.

The output may comprise parallel signals, as indicated, or these may be multiplexed into serial frames of spectral component data. These data are then processed in a manner which attenuates low magnitude spectral components relative to high magnitude spectral components.

If the output data from the first conversion stage comprises a frame of analogue representations of spectral components then the processing may be simply achieved by providing an element with a non-linear transfer characteristic (as hereinafter described); if the output data from the first conversion comprises a number of parallel analogue representations then a bank of such elements may be provided.

If the output from the first conversion stage is in digital form, it may readily be processed by general-purpose or dedicated data processing means programmed to provide a non-linear response, as hereinafter described, for example by providing a look-up table of output levels for given inputs or a polynominal approximating to the desired characteristic.

Figure 2A:
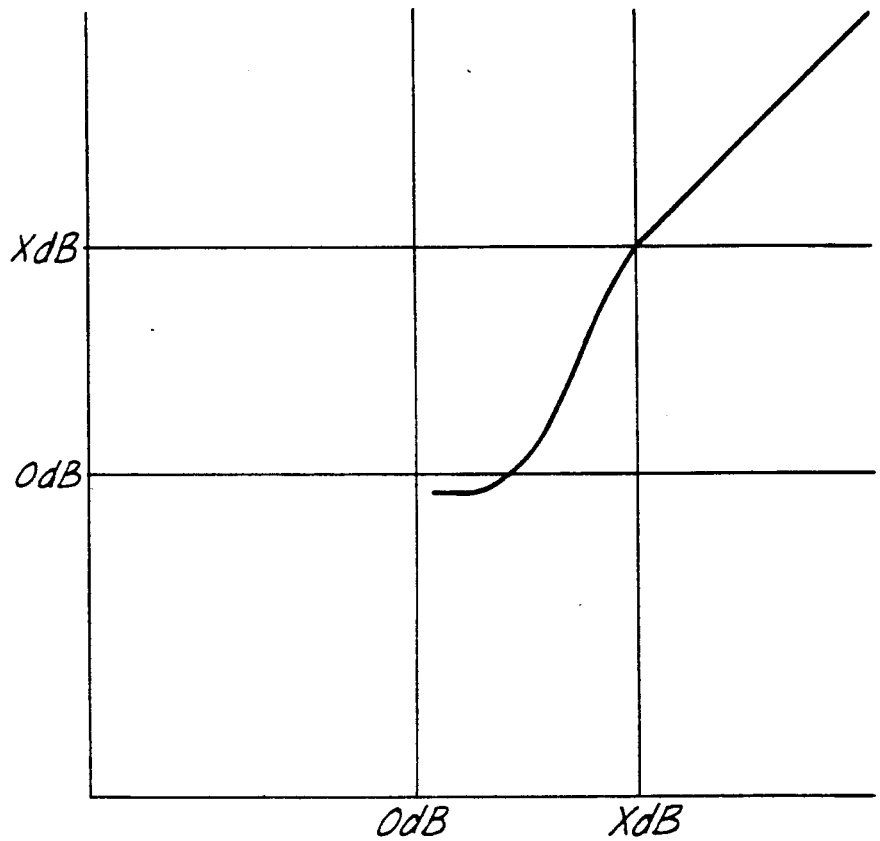
FIGS. 2a–b show schematically transfer characteristics in accordance with the invention drawn on logarithmic axes.

Referring to FIG. 2a, which shows a typical non-linear characteristic exhibited by the processing stage, it will be evident that a signal representing a spectral component having a magnitude larger than the top of the non-linear portion of the characteristic (in this case, labelled X dB) will be treated linearly by the processing stage, since the slope of the log/log representation of the characteristic is unity (it will be understood that on log/log axes, a non-linear function may be represented by a non-unity slope and references to 'non-linear' herein refer to normal rather than logarithmic axes). The relationship between the magnitudes of all spectral components having a magnitude larger than X dB is therefore undisturbed by the processing stage, since all such components are amplified or attenuated by an equal factor.

Although the non-linear portion of the curve shown in FIG. 2a could theoretically follow any smooth curve between a straight line with unity slope and a vertical straight line, it will always be a compromise between these extremes, as the first is ineffective and the second (which corresponds to gating in the frequency domain) will generally introduce unacceptable distortion. The processed signal produced by the invention is thus a compromise between a reduced level of noise and an introduced level of distortion, and the acceptability of the result is strongly dependent upon the shape of the nonlinear portion of the transfer characteristic, and on the position of the knee region relative to the signal level.

Below the X dB point is a smooth 'knee' region, where the non-linear portion of the characteristic joins the linear portion without discontinuities in slope. Immediately below the knee region is a non-linear portion, which on the log/log plot in FIG. 2a has an average slope of approximately 2.2 for most of its length. The shape of the non-linear portion at very low input levels is not particularly important, provided it continues to have a positive slope; the important features of the characteristic as a whole are that above the knee there is a linear portion so that the harmonic relationship of components above this level are undisturbed, that the non-linear portion should fall away steeply enough to attenuate noise below the kne region, and that the knee region itself should be a smooth curve so that the listener does not perceive any significant difference as a spectral component moves through the knee region with time.

Figure 2B:
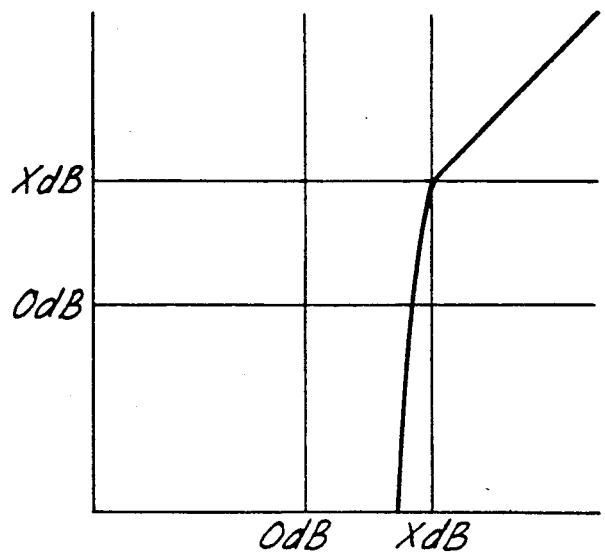

If the signal to noise ratio is high, a non-linear portion which deviates only slightly from linearity will be preferred so as to introduce the minimum signal distortion. For low signal to noise ratio conditions on the other hand, a greater deviation from linearity is required. FIG. 2b shows an extreme example of a characteristic according to the invention in which on the log/log axes the non-linear portion has a slope of approximately 10 below the knee region down to the limit of audibilityh (labelled 'OdB'). Although noise is effectively reduced by this characteristic, the quality of a speech signal is distorted to a normally unacceptable (though intelligible) level so that for most speech signal purposes (for example telephone subscriber services) this represents the extreme limit to the severity of the non-linear portion.

Such a characteristic may be derived, for example, by iterative techniques. Equally, the production of an analogue device having such a transfer function is straightforward to one skilled in the art.

Finally, if the signals representing the spectral components are in fact simply those spectral components (as when a bank of band pass filters are used) then the tranfer function of the processing means must be nonlinear with regard to the peak or average value of each component, rather than to its instantaneous value, or the signal will be distorted. The processing means is thus akin to an audio compander.

After processing, major components of the signal will therefore have been passed by the processing means with linear amplification or attenuation, but noise in regions of the spectrum where there are no major components of the signal will have been relatively attenuated by a greater amount (as of course will weak components of the signal). It will be seen that noise is not altogether removed, but merely relatively attenuated, and this gives a more natural sounding result during non-speech periods.

Referring again to FIG. 1, the signals representing the spectral components are then reconverted back to an intelligible time-varying signal by a second conversion stage which simply performs the inverse operation of the first conversion stage. In the case of a system employgin a Discrete Fourier Transform as its first stage, for example, the second conversion performs the Inverse Discrete Fourier Transform (IDFT).

Figure 3A:
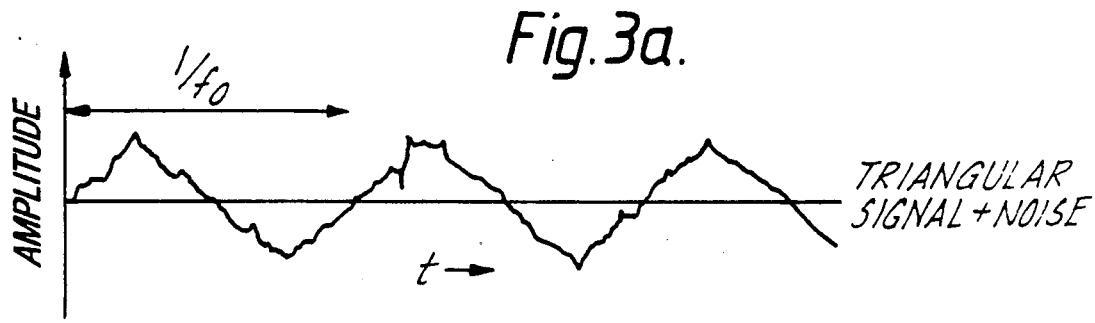
FIGS. 3a–e shows schematically how a noisy triangular signal is processed by various stages of the invention.

Referring now to FIGS. 3a-e, an input signal illustrated in this case by a triangular wave for simplicity is corrupted by random noise (see FIG. 3a). The input is resolved into its spectral components, so that for the triangular signal the signal power is concentrated in spectral components except at odd multiples of the fundamental frequency of the signal.

The magnitude of the noise signal in any frequency interval, on the other hand, is (for white noise) proportional to the width of that frequency interval, so that the noise power is spread over the spectrum.

Figure 3B:
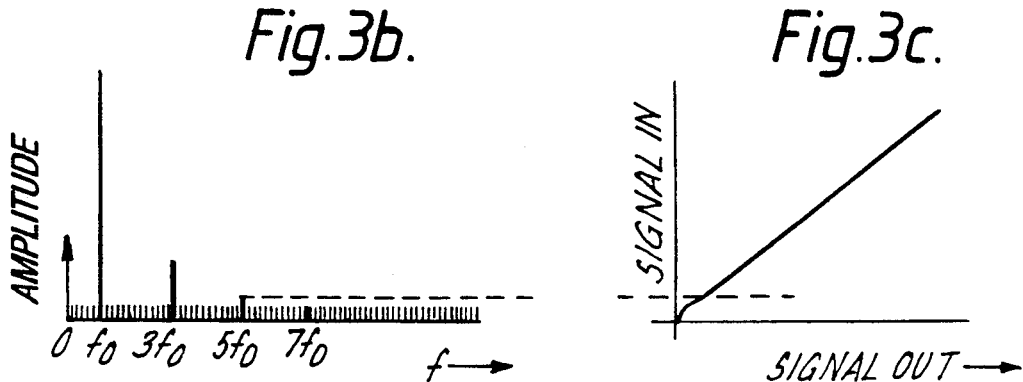

This is illustrated (diagramatically) in FIG. 3b (where it is apparent that the harmonic at 7 times the fundamental frequency is below the level of the noise in that spectral region).

Figure 3C:
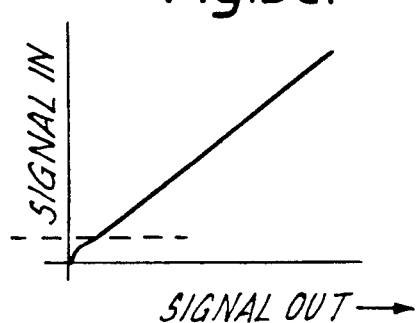
Figure 3D:
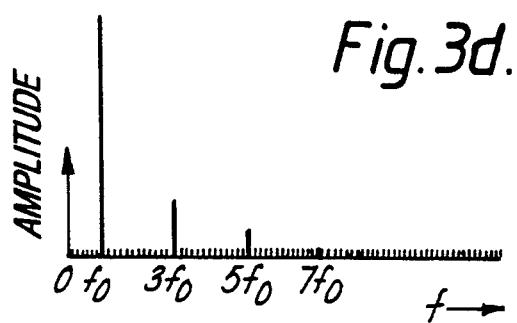

The processing stage characteristic shown in FIG. 3c has a knee region at a point above the level of the noise (note that the transfer characteristic is illustrated for convenience with its axes reversed relative to FIGS. 2a and 2b, and with linear rather than logarithmic scales). If the slope of the linear portion of the characteristic on identical linear axes is 45 degrees, for example, any signal above the knee region will be passed unattenuated and any signal below will be attenuated. In this case, the first three liens (n=1, 3 and 5) of the spectrum of the triangular signal are passed unattenuated and the noise spectrum (together with higher order lines of the signal spectrum) are strongly attenuated (see FIG. 3d).

Figure 3E:
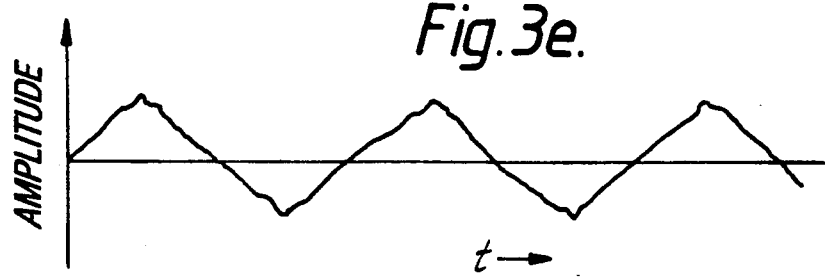

The second conversion stage will then reconstruct a time-domain signal as indicated in FIG. 3e, with the noise level strongly reduced, and some minor distortion of the signal produced by the attenuation of higher harmonics of the signal.

Figure 4:
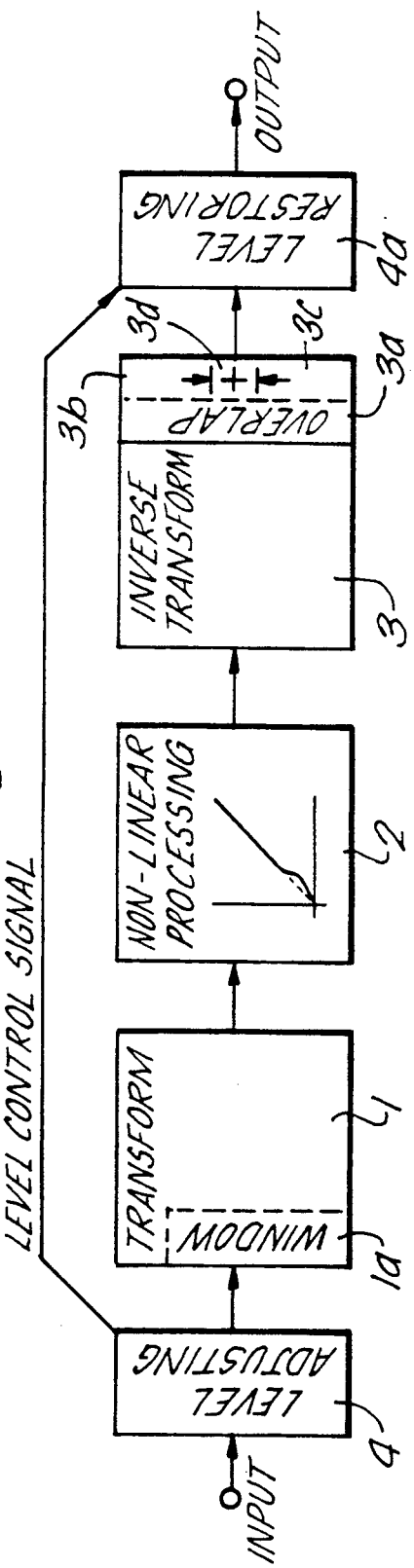
FIG. 4 shows schematically apparatus according to a first embodiment of the invention.

FIG. 4 shows a specific embodiment of the invention in which each stage of signal processing is performed by discrete means. The first conversion stage is effected by a conversion means 1, which comprises a Fast Fourier Transform device of known type. Such a device is arranged to receive data input in frames of sampled values. For a speech signal, the length of such a frame should at any rate be shorter than the length of a syllable, and to maointain accuaracy should preferably be as short as possible (a further factor is the possibility that unacceptable delays may be introduced by long frames). On the other hand, to obtain a reasonable transform it is desirable to sample a large number of points which requires fairly long frames. In practice, frames of between 128 and 1024 points have been found practicable.

When using short frames and hence limited numbers of samples, the effects of the shape and size of the frame are evident in the transform as frequency "leakage" of the spectral components of the signal. The sampled frame is in effect the product of multiplying the input signal with a rectangular window function having a value of 1 during the sampling period and 0 before and afterwards.

It will be evident to one skilled in the art that the spectrum produced by the transform is therefore the convolution of the true signal spectrum with the transform of the rectangular window function, which will of course introduce extra unwanted frequency components (as explained for example in "Introduction to Digital Filtering" edited by R. E. Bogner and A. G. Constanides, published by John Wiley & Sons; at p134). This problem can be to some extent compensated by the use of a non-rectangular window function to weight the sampled data. A great many functions of this type are known in the art.

Figure 5:
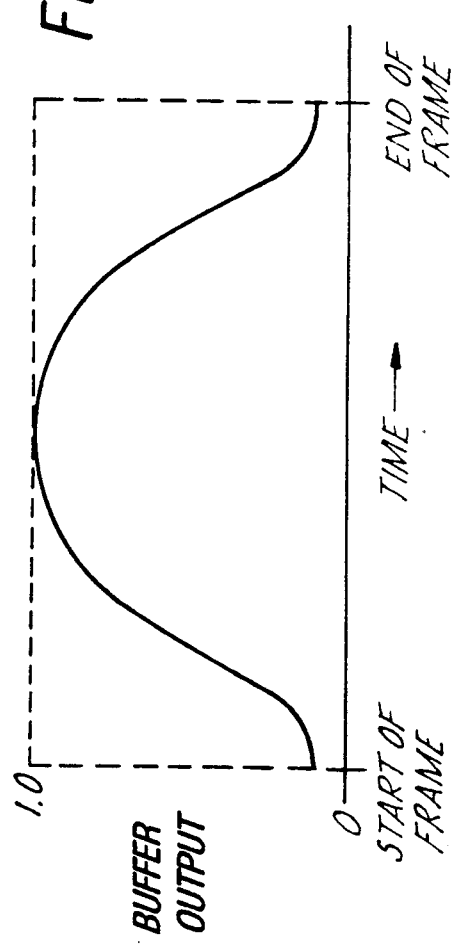
FIG. 5 shows schematically the form of a window function for use in accordance with one embodiment of with the invention.

Accordingly, conversion means 1 includes a window function means 1a, which multiplies received data points in a frame by windowing coefficients. Preferably, a Hanning function is employed. FIG. 5 illustrates the general form of such a function.

Each such window frame is received by the transform means which executes a Fast Fourier Transform upon the data in known fashion and produces a number of spectral component signals (the Fourier coefficients), the number being governed by the numbe of sample data in each frame.

The spectral components, which will usually comprise frames of digital samples, are then passed to a non-linear processing means 2 which may be provided for example by using a look-up table, and are either (if above the knee region of the characteristic) passed linearly or (if below the knee region of the characteristic) strongly relatively attenuated as described above.

The frames of processed spectral components are then passed to the second conversion means 3, which executes the Inverse Fast Fourier Transform to reconstitute a time-domain signal.

Where a window function has been employed prior to transforming the input data, there will be variations in the level of the input to the transform device with time since the level will fall away towards each end of each frame. When the inverse transform is executed by the conversion means 3, the reconstituted time-domain signal is in effect amplitude modulated by the window function at the frame frequency. To reduce these amplitude variations, and hence improve the quality of the output signal, it is desirable to "overlap" data from succeeding output frames (in a manner generally known in the art), which has the effect of restoring the envelope of the signal to a good approximation.

Accordingly, the second conversion means 3 includes an overlapping means 3a, such as a pair of overlapped data buffers 3b, 3c and an adder 3d, which produces frames of output data with some degree of overlap. The degree of overlapping that is necessary and desirable depends on the shape of the window function, and varies from zero in the case of a rectangular window upwards for other windows. In the case of a Hanning function, an overlap of 50% is found particularly effective.

FIG. 6 shows the effect of overlapping by 50% of a frame. In FIG. 6a, the amplitude of each output frame 1,2,3 produced by buffer 3b is multiplied by the window function so that there is an audible modulation at frame frequency. Buffer 3c produces an output of frames 1,2,3 but delayed by n samples (in other words 50% of the length of each frame). Adder 3d adds the outputs of buffers 3b and 3c together, in other words adds to each sample $i_k$ produced by buffer 3b, the corresponding sample $i_{k-n}$ produced by buffer 3c, to produce overlapped output frames I,II,III.

The means to effect such windowing and overlapping functions may, of course, comprise either analogue or digital means as convenient, and it will be understood that window function means 1a and overlapping means 3a might be included within a conversion means 1 and 3 respectively as part of a single chip device.

In many systems, the level of the signal may vary slowly with time (as in the case of a fading radio signal, for example) and, independently, the noise level may also vary. In some cases, the two will vary together (as, for example, when an already noisy signal is subject to fading). For the invention to work effectively, it is desirable that most of the signal should remain above the knee region of the characteristic (and the knee region should remain above the noise level), and so some means of positioning the signal relative to the knee region is necessary (although it will be appreciated that the characteristic could itself be adjusted instead).

Accordingly, level adjusting means 4 and level restoring means 4a are provided (see FIG. 4) which ensure that the signal is correctly positioned upon the transfer characteristic of non-linear processing means 2. As shown, the level adjusting means 4 detects slow changes in the total power of the signal, and amplifies or attenuates the signal to keep the noise spectrum below the knee and most of the signal above the knee. At the same time level adjusting means 4 sends a control signal to level restoring means 4a so that the processed signal may be restored to its original level. In the simple case where the levels of signal and noise vary together, without significant change in the signal-to-noise ratio, the level adjusting means 4 may be an automatic gain control, and the level control signal is an indication of the gain which acts to control the gain of the level restoring means 4a (the response being slow enough to smooth out fluctuations in level caused by, for example, pauses between spoken words). The invention is generallyy most effective with signal-to-noise ratios of above +10 dB, and preferably above +18 dB, so the automatic gain control (which responds to the level of signal+-noise) is effectively responding to the signal level.

With very low signal to noise ratio applications, however, the level adjusting means could alternately measure one or the other separately, although this separation is technically difficult.

Level adjusting means 4 could equally be placed between the transform means 1 and processing means 2, so as to operate in the frequency domain, and likewise level restoring means 4a could equally be placed between processing means 2 and inverse transform means 3. In this case, an estimation of signal level can be made as before by examining the magnitude of the largest transform coefficients (which should usually represent signal terms).

Using this latter approach, it will also be possible under some circumstances to derive an approximate signal-to-noise ratio by comparing this signal level with a noise level derived from the magnitudes of the smallest transform coefficients, which should represent noise data; this mayy also be used to position the signal relative to the characteristic.

It is also possible to omit level restoring means 4a, if a constant level output signal is acceptable.

In a second embodiment of the invention, available knowledge about the spectral position of signal data may be utilized to further enhance the noise reduction capability of the invention. Huuman speech consists of a mixture of "voiced" and "unvoiced" sounds, depending on the presence or absence of glottal action. In most cases these waveforms are processed by the vocal tract, which, being tubelike, gives rise to spectral enhancement in certain bands of frequencies. These enhancements are known as 'formants'.

The spectral position of each formant varies between individuals, and further varies while an individual is speaking.

Nonetheless, it will often be possible to statistically predict that signal information is more likely to lie in certain spectral bands than in others. In a second embodiment different a non-linear processingis applied to spectral bands where signals are likely than is applied to bands where noise is likely. The non-linearity will be more pronounced in "noise" bands than in "signal" bands. A range of elements exhibiting different non-linear characteristics, either having different knee regions or different shapes in their non-linear regions, or both, may be provided so that the transition between spectral bands is smoothed.

In one such method illustrated in FIG. 7a, a speech signal is level adjusted, windowed and transformed as previously described. The spectral component signals are then passed to processing means 2, which assigns different component signals to processing elements 2a, 2b, etc., having different characteristics. As shown, if the spectral component signals form a spatially separate series of signals, then signals are physically connected directly to processing elements 2a, 2b etc. Element 2a, having a very low non-linear characteristic, is used to process signals in bands where speech components are statistically rare (noise bands) and element 2b, having a less non-linear characteristic, is employed to process signals in bands where formants are commonly found (speech bands).

If the spectral component signals are provided in time-divided frames, then processing means 2 may include a demultiplexer (not shown) to assign the spectral component signals to discrete elements 2a, 2b etc. or a single processing element may be used and its characteristic controlled by control means (not shown) within the processing means 2, so that it exhibits the required predetermined characteristic for each spectral component signal. The processed signals are then retransformed and overlapped by second conversion means 3, and their level restored by level restoring means 4a, as described previously.

In another such method shown in FIG. 7b, means are arranged to detect the time-averaged positions of signal bands and non-signal bands for each call over the initial part of the signal (for example the first few seconds of a phone call), and the output of such means is then used to assign the spectral components to processing elements as before for the duration of the call; this embodiment is therefore capable of adapting to different callers. Referring to FIG. 7b, the incoming signal is windowed and transformed as previously described. The spectral component signals are then passed to processing means 2, which assigns component signals to processing elements 2a, 2b, etc., having different characteristics. The separately processed components are then recombined, retransformed and overlapped as previously described by conversion means 3.

The processing means 2 may include assignment means 20 capable of routing spectral component signals to different processing elements 2a, 2b, etc., in accordance with assignment control signals as shown, or alternatively the processing means 2 may comprise one or a plurality of processing elements with characteristics which may be varied in accordance with assignment control signals. The assignment control signals are here provided by averaging means 5, which derive time-average information on the positions of formant bands from the output of transform means 1 over the first part of a call and then transmit assignment control signals to processing means 2 to fix for the rest of the call the processing which each spectral component will undergo. The averaging means 5 could form part of the processing means.

It should be emphasized that in the above two versions of the second embodiment, data representing respectively the population-averaged or time-averaged likely positions of the speech formant bands is used to fix the processing applied to spectral components either for the duration of the call or for a relatively long re-adaptation period.

Figure 8:
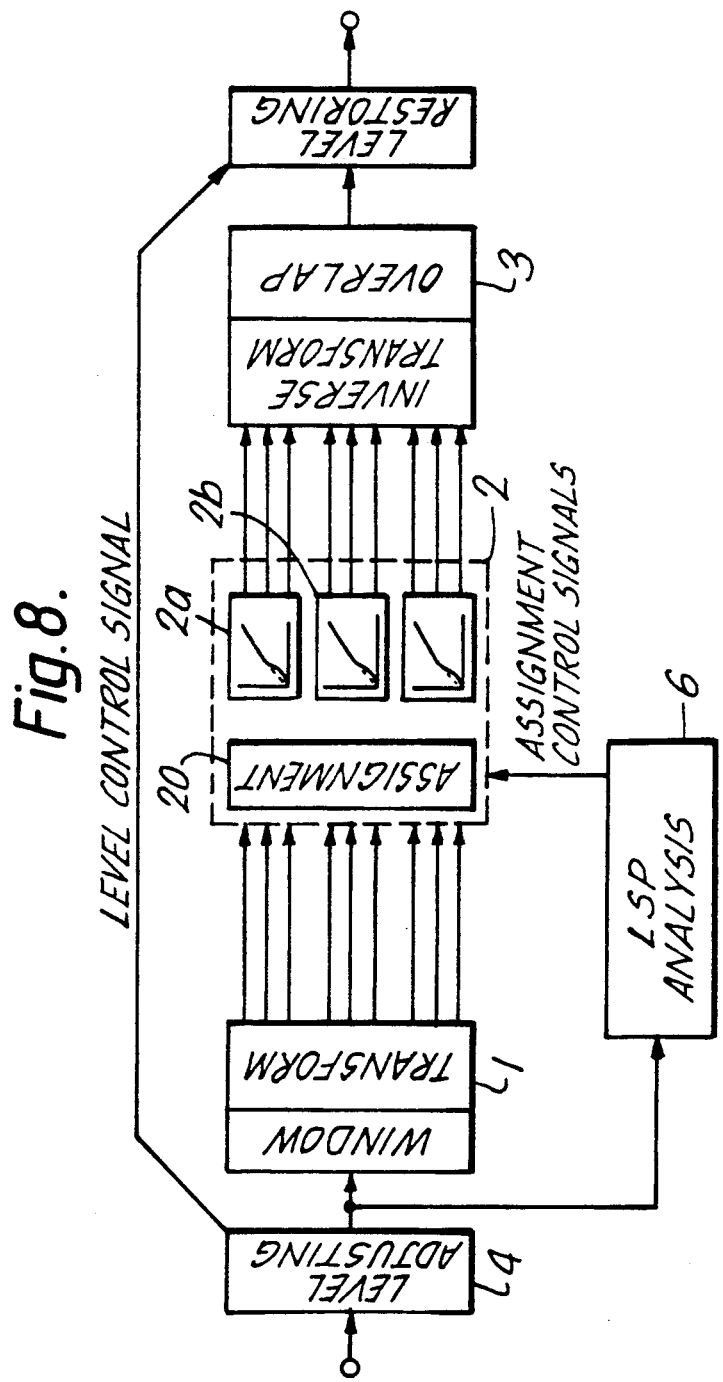
FIG. 8 shows schematically a third embodiment of the invention.

In a third embodiment of the invention, however, a means is provided for continuously tracking the positions of the formant bands during a call as illustrated in FIG. 8. This enables a much closer and more rapid matching of the processing elements with the formant bands and corresponding more effectively noise reduction, since noise outside the formant band can be virtually eliminated. The characteristics of the processing elements may be graduated between formant and non-formant regions, so as to produce a smooth transition. The more the available data on the shape of the formant band, the more effective is the matching of the processing means. One technique which may be employed is the 'Line Spectral Pair' or LSP technique which can provide an estimate of both formant frequency and formant width information if a filter of suitable order is employed.

The operation of this embodiment is as described above for FIG. 7b, except that instead of assigning the signals to processing once, the processing is continually reassigned in accordance with assignment control data from tracking means 6, which here comprises a means for executing an LSP analysis of the signal to determine its formant spectral positions and spectral widths.

It will be appreciated that references to speech signals above apply equally to any type of signal haviing a similar spectral content, and that the invention is applicable also to voiceband data signalling.

In many implementations, a signal (for example, a speech signal) is decomposed into its spectral components at a transmitter, representations of the spectral components are transmitted to a receiver, and the original signal is there reconstituted. It will readily be appreciated that the invention described above is equally applicable to this class of coding schemes, to remove or reduce any broadband noise which accompanies the input signal (for example, broadband background noise in a speech system). Such implementations merely constitute positioning the transmission link between the non-linear processing stage and one of the transform stages. In a first such embodiment, an input signal is transform coded and the transform coefficients thus produced are processed according to one of the methods described above at the transmitter, the processed coefficients then being transmitted to a receiver of conventional type which affects the inverse transform to reconstitute the signal. In a second such embodiment, the transform coder at the transmitter is of conventional type, and at the receiver the received transform coefficients are subjected to a non-linear processing stage as described above, prior to the inverse transform operation to reconstitute the original signal.

It will be appreciated that although discrete means for performing each function are illustrated, the invention may be advantageously provided as a single integrated circuit, such as a suitably programmed Digital Signal Processing (DSP) chip package, and in its method aspect, each step may be performed by a suitably programmed digital data processing means.

I claim:

1. A noise reduction apparatus comprising:
   first conversion means for converting a time-varying input signal into output signals representing the magnitude of spectral components of said input signals;
   processing means for applying to said output signals a transfer characteristic which attenuates the low magnitude spectral components of said output signals relative to the high magnitude spectral components of said output signals, said transfer characteristic being substantially linear for said high magnitude spectral components and non-linear for said low magnitude spectral components, said non-linear region having an average slope not exceeding 10 at detectable signal levels on a plot having identical logarithmic axes for said output signals and said transfer characteristic, and
   second conversion means for converting the output of said processing means into a time-varying signal.

2. A noise reduction apparatus as in claim 1 wherein said transfer characteristic comprises a plurality of transfer characteristics which attenuate the low magnitude spectral components of said output signals relative to the high magnitude spectral components of said output signals, said transfer characteristics being substantially linear for said high magnitude components and non-linear for said low magnitude components, different said transfer characteristics being assigned to various portions of the frequency spectrum of said output signals.

3. An apparatus as in claim 2 in which the frequency assignment of said different transfer characteristics is predetermined.

4. A noise reduction apparatus comprising:
   first conversion mmeans for converting a time-varying input signal into output signals representing the magnitude of the spectral components of said input signal;
   processing means for applying to said output signals a plurality of transfer characteristics which attenuate the low magnitude spectral components of said output signals relative to the high magnitude spectral components of said output signals, said transfer characteristics being substantially linear for said high magnitude components and non-linear for said low magnitude components, different said transfer characteristics being assigned to various portions of the frequency spectrum of said output signals, said processing means further comprising means for delivering a time-average spectral distribution of said output signals, and means for periodically determining the frequency assignment of said different transfer characteristics in accordance with said time-averaged spectral distribution; and
   second conversion means for converting the output of said processing means into a time-varing signal.

5. A noise reduction apparatus comprising:
   first conversion means for converting a time-varying input signal into output signals representing the magnitude of the spectral components of said input signal;
   processing means for applying to said output signals a plurality of transfer characteristics which attenuate the low magnitude spectral components of said output signals relative to the high magnitude spectral components of said output signals, said transfer characteristics being substantially linear for said high magnitude components and non-linear for said low magnitude components, different transfer characteristics being assigned to various portions of the frequency spectrum of said output signals, said processing means further comprising means for detecting the spectral position of components of said output signals, and means for varying the frequency assignment of said different transfer characteristics in accordance with the spectral position of components of said output signals, and second conversion means for converting the output of said processing means into a time-varying signal.

6. An apparatus as in claim 5, in which said detection means employs a Line Spectral Pair analysis method to detect the spectral position of components of said output signals.

7. A noise reduction apparatus comprising:

first conversion means for converting a time-varying input signal into output signals representing the magnitude of the spectral components of said input signals;

processing means for applying to said output signals at least one transfer characteristic which attenuates the low magnitude spectral components of said output signals relative to the high magnitude spectral components of said output signals, said transfer characteristic being substantially linear for said high magnitude components and non-linear for said low magnitude components;

level adjusting means for maintaining the spectral components of said output signals within a predetermined relationship with said transfer characteristic, said level adjusting means being operatively coupled to said processing means, and second conversion means for converting the output of said processing means into a time-varying signal.

8. Apparatus as in claim 7, in which said level adjusting means is an automatic gain control circuit responsive to the average level of said time varying input signal.

9. Apparatus as in claim 7, in which said level adjusting means maintains the noise spectrum of said output signals in the non-linear region of said transfer characteristic.

10. A method of reducing noise in a time-varying signal comprising the steps of:

(a) converting the time-varying signal into a plurality of signals representing the magnitude of spectral components of the time-varying signal;

(b) processing signals of different spectral components so that low magnitude spectral components are attenuated relative to high magnitude spectral components while leaving the relationship between the high magnitude spectral components, said processing differs between different spectral components;

(c) converting the processed signals into a time-varying signal having an attenuated noise content; and (d) adjusting the level of at lest some of the spectral components of the time-varying signal to maintain these components within a predetermined relationship.

11. A noise reduction apparatus comprising:

first conversion means for converting a time-varying input signal into output signals representing the magnitude of the spectral components of said input signal;

processing means for applying to said output signals at least one transfer characteristic which attenuates the low magnitude spectral components of said output signals relative to the high magnitude spectral components of said output signals, said transfer characteristic being substantially linear for said high magnitude components and non-linear for said low magnitude components;

level adjusting means for maintaining the spectral components of said output signals within a predetermined relationship with said transfer characteristic, said level adjusting means operatively coupled to said apparatus to adjust said input signal, said output signals or said at least one transfer characteristic, and second conversion means for converting the output of said processing means into a time-varying signal.

* * * * *